United States Patent
Kirkpatrick et al.

(10) Patent No.: US 6,921,721 B2
(45) Date of Patent: Jul. 26, 2005

(54) POST PLASMA CLEAN PROCESS FOR A HARDMASK

(75) Inventors: Brian K. Kirkpatrick, Allen, TX (US); Clint L. Montgomery, Coppell, TX (US); Brian M. Trentman, Sherman, TX (US); Randall W. Pak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/692,609

(22) Filed: Oct. 24, 2003

(65) Prior Publication Data

US 2005/0090115 A1 Apr. 28, 2005

(51) Int. Cl.[7] .................. H01L 21/302; H01L 21/461
(52) U.S. Cl. ........................... 438/706; 438/763
(58) Field of Search .................. 438/623, 624, 438/637, 638, 706, 740, 783

(56) References Cited

U.S. PATENT DOCUMENTS

| 6,032,682 | A | | 3/2000 | Verhaverbeke |
| 6,095,882 | A | * | 8/2000 | Wells et al. ............... 445/24 |
| 6,287,961 | B1 | * | 9/2001 | Liu et al. .................. 438/638 |
| 6,750,117 | B1 | * | 6/2004 | Hung et al. ............... 438/437 |
| 2004/0150012 | A1 | * | 8/2004 | Jin et al. .................. 257/255 |

* cited by examiner

Primary Examiner—Phuc T. Dang
(74) Attorney, Agent, or Firm—Peter K. McLarty; W. James Brady, III; Frederick J. Telecky, Jr.

(57) ABSTRACT

The present invention provides a process of manufacturing a semiconductor device that comprises a process of manufacturing a semiconductor device that includes plasma etching 250 through a patterned hardmask layer 210 located over a semiconductor substrate 225 wherein the plasma etching forms a modified layer 210a on the hardmask layer 210, and removing at least a substantial portion of the modified layer 210a by exposing the modified layer 210a to a post plasma clean process.

10 Claims, 12 Drawing Sheets

POST PLASMA CLEAN PROCESS FOR A HARDMASK

TECHNICAL FIELD OF THE INVENTION

The present invention is directed, in general, to a clean process used in the fabrication of a semiconductor device and, more specifically, to a post plasma clean process that removes at least a substantial portion of a modified surface of a hardmask used in forming a structure of a semiconductor device.

BACKGROUND OF THE INVENTION

In the manufacture of semiconductor devices, photoresist masks are typically employed to protect areas which are not to be treated in a particular processing step, such as etching or implantation. After the processing step is completed, the photoresist is removed, and the next step in the manufacturing process is performed. For a given device, it may be necessary to apply and remove photoresist for as many as 50 or more different processing steps, and it is important that all of the photoresist be completely removed after each step to avoid contamination and defects.

Originally, photoresist was removed chemically, but this method is no longer in wide use due to environmental problems and the relative high cost. Today, photoresist is most commonly stripped or "ashed" in plasma reactors which employ an RF discharge to produce oxygen radicals which combine with the hydrocarbons of the photoresist to produce water and carbon dioxide which are in gaseous form and are easily disposed of.

As device technologies have shrunk to sub-nanometer designs, it has become increasingly difficult to achieve the required high resolution with the use of photoresist alone. To achieve the higher resolution needed for patterning sub-nanometer designs, semiconductor manufacturers have turned to using a thinner photoresist in conjunction with a hardmask material, such as silicon, silicon nitride or oxynitride or bilayers thereof, in conjunction with the photoresist or in place of the photoresist altogether. Typically, the photoresist is used to initially pattern the hardmask material, and it is then removed. The etch is then conducted through the hardmask layer versus the photoresist layer. This process allows for the use of thinner photoresist layers, and the hardmask provides more etch control during the etch process without the need to worry further with the presence of a photoresist layer.

Typically, a post ash clean is performed after each pattern formation and subsequent process, such as ion implantation and etching processes, to remove the residues remaining after the mask is ashed. Conventional post ash cleans are well known, and useful combinations include sulfuric/peroxide (SPM), ammonium hydroxide/peroxide (APM), or hydrochloric acid/peroxide (HPM), chemistries. When a hardmask is used in place of or in addition to photoresist, a hydrofluoric acid (HF) chemistry is also often added to the clean sequence. Unfortunately, however, when this hardmask etch is followed by a silicon etch, the above-mentioned conventional chemistries are not sufficient to remove all post etch residues associated with the hardmask.

Therefore what is needed in the art is a post clean process that avoids these disadvantages.

SUMMARY OF THE INVENTION

To address the above-discussed deficiencies of the prior art, the present invention provides a process of manufacturing a semiconductor device that comprises plasma etching through a patterned hardmask layer located over a semiconductor substrate wherein the plasma etching forms a modified layer on the hardmask layer, and removing at least a substantial portion of the modified layer by exposing the modified layer to a post plasma clean process.

In another embodiment, the present invention provides a process of manufacturing an integrated circuit. In this particular embodiment, the method comprises forming isolation trenches in a semiconductor substrate, including plasma etching through a patterned hardmask layer located over a semiconductor substrate wherein the plasma etching forms a modified layer on the hardmask layer, and removing at least a substantial portion of the modified layer by exposing the modified layer to a post plasma clean process. The process further includes forming transistor structures on or within the substrate and between the isolation trenches and forming interconnects within dielectric layers located over the transistors structures to interconnect the transistor structures to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

The present invention recognizes the advantages associated with removing at least a substantial portion of a modified layer of a hardmask by use of a post plasma clean process that follows a plasma etching process conducted through a patterned hardmask. It has been discovered that there is a close correlation between the use of a hardmask layer in the formation of semiconductor structures, such as shallow trench isolation (STI) structures, and defects that occur in the manufacture of those devices. While the present invention is not limited by any particular theory of operation, it is believed that the plasma etch chemically modifies the portion of the hardmask material that is exposed to the plasma, which is typically the upper or outer portion of the hardmask. Modification in this case refers to ion bombarding or impregnating the outer or top layer of the hardmask with silicon, oxygen or carbon, during the formation of trench isolation structures. The modification forms a film on the hardmask that has a different level of stress than the underlying or overlying material. This stress differential makes the modified hardmask film susceptible to flaking, particularly when it is exposed to a stressful environment that might occur during a high density plasma process. The high density plasma process, such as a high density plasma silicon oxide deposition process, is often characterized by an additional bias extraneous to other circumstances that are occurring, which result in energetic ion bombardment. This ion bombardment typically causes a condition often referred to as sputter etching or "etching." While the high density plasma process has been and will be referred to throughout the remainder of the document, those skilled in the art understand that other plasma processes, such as medium density plasma processes, could cause similar effects.

Figures 1A, 1B:
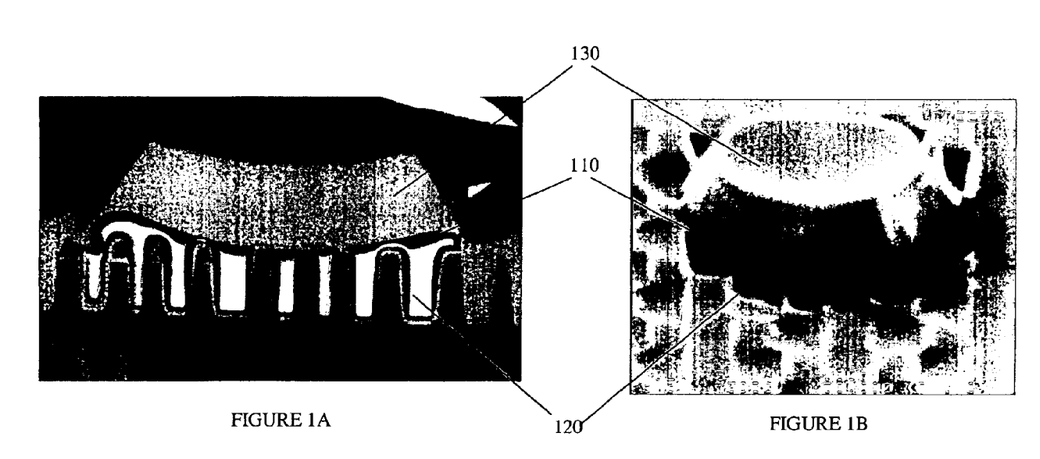
FIGS. 1A through 1C are photographs of hardmask defects located on a semiconductor substrate following a conventional post ash clean process and subsequent high density plasma oxide deposition.
Figure 1C:
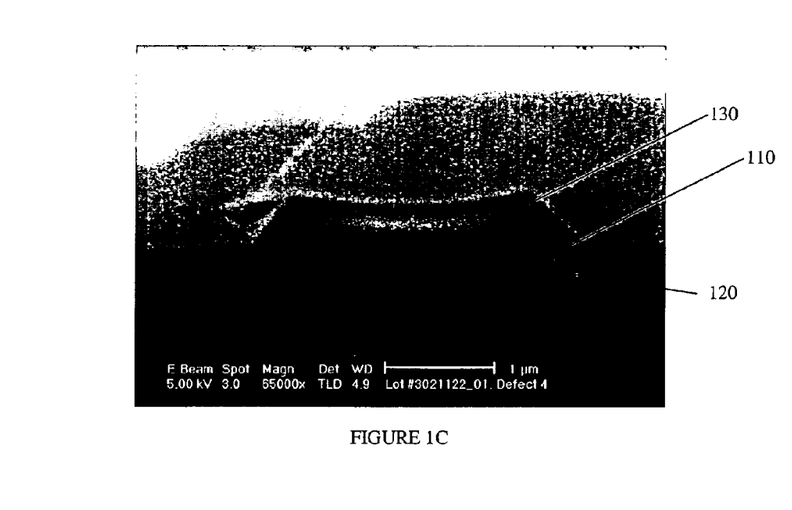

It has also been found that conventional post ash clean chemistries used to remove photoresist residues, such as those discussed above, are not sufficient to remove this modified layer and associated residues. If this modified layer is not removed, during subsequent isolation oxide depositions it may flake off to form defects on the surface of the substrate, which can seriously affect the proper operation of the device. Examples of such defects are illustrated in FIGS. 1A, 1B and 1C, which show defects 110, or flakes, formed over the STI structure 120 and in the first few moments of the isolation oxide deposition, which then subsequently block the remaining isolation oxide deposition 130 creating "killer defects" of missing field isolation. This, of course, reduces device yield, which, in turn, increases production costs.

Figure 2A:
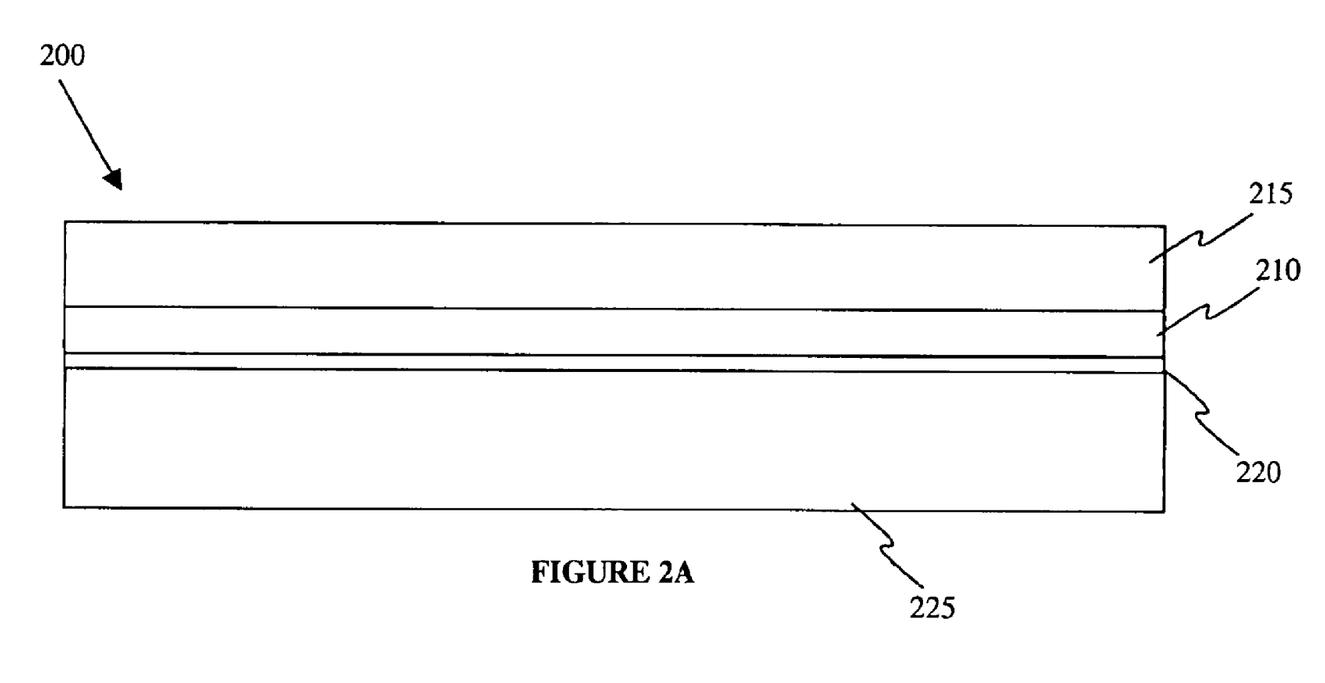
FIGS. 2A through 2G illustrate sectional views of a semiconductor structure provided by the present invention at various stages of fabrication.
Figure 2B:
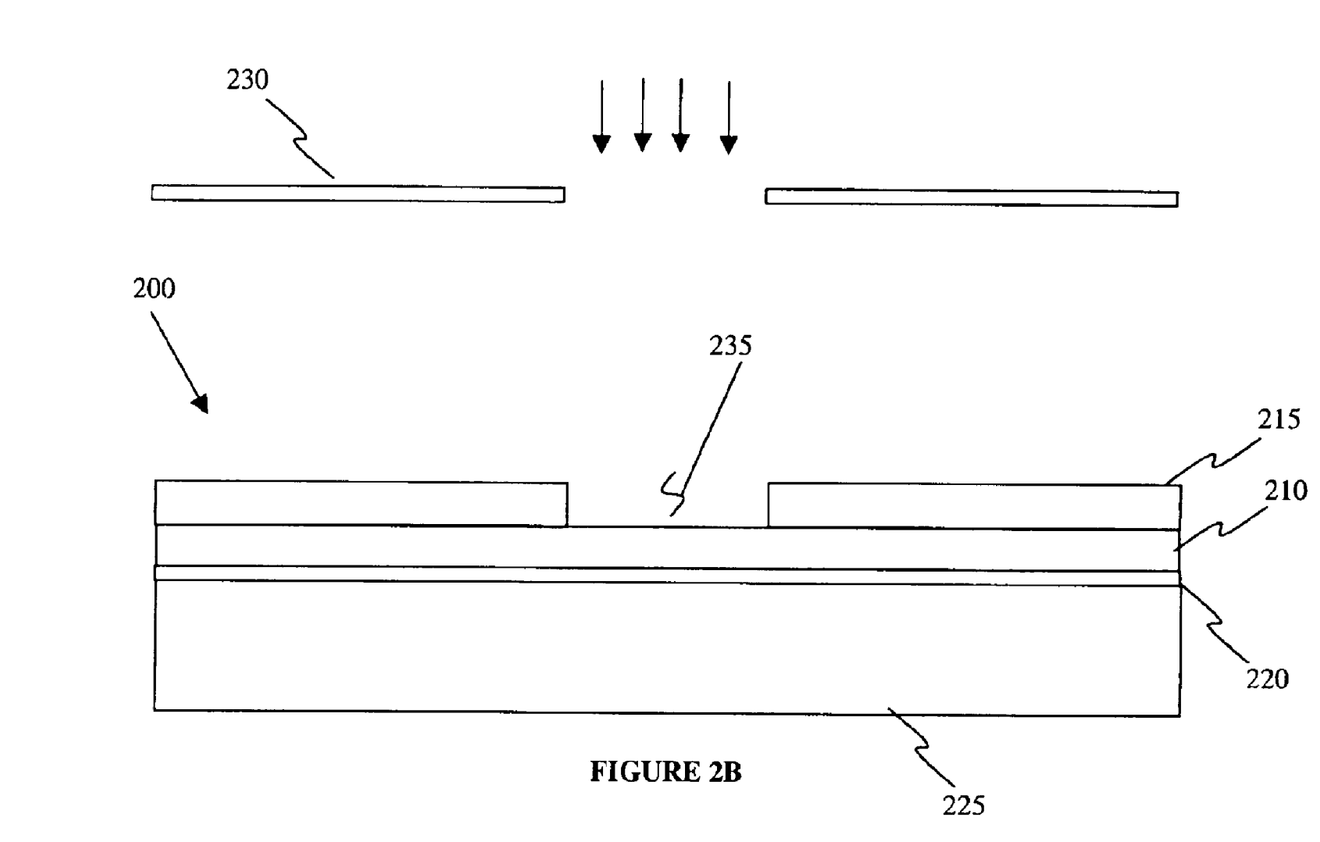

Turning now to FIGS. 2A–2G, there are illustrated sectional views of a semiconductor device 200 at various stages of fabrication. As shown, in FIG. 2A, a conventional photoresist layer 215 and hardmask layer 210 have been conventionally deposited on a pad oxide 220 located on a semiconductor substrate 225, such as a silicon substrate. The hardmask layer 210 may be a variety of materials. For example, the hardmask layer 210 may be comprised of silicon nitride or silicon oxynitride. However, in other embodiments, the hardmask layer 210 may be silicon or silicon carbide. In many applications, however, the hardmask layer 210 is silicon nitride. Subsequent to this deposition, the photoresist layer 215 is exposed through a mask 230 and patterned using conventional lithographic processes to form an opening 235 in the photoresist layer 215, as shown in FIG. 2B, which exposes a portion of the underlying hardmask layer 210, as shown. A conventional hardmask etch 240, for example one using fluorocarbon gases (e.g., $CF_4$ or $CH_2F_2$) at a pressure ranging from about 10 mT to about 100 mT, with an exemplary pressure ranging from about 10 mT to about 50 mT, and a bias power ranging from about 200 watts to about 500 watts, is then conducted through the opening 235 to remove the exposed portion of the hardmask layer 210 to form a guide opening 245 in the hardmask layer 210. Typically, this etch will consume a large portion of the photoresist layer 215 such that the photoresist layer 215 becomes a much thinner layer 215a, as shown. The hardmask etch 240 may be stopped at the pad oxide layer 220, or it may be continued into the pad oxide a small distance, which is shown as thin pad oxide area 220a.

Figure 2C:
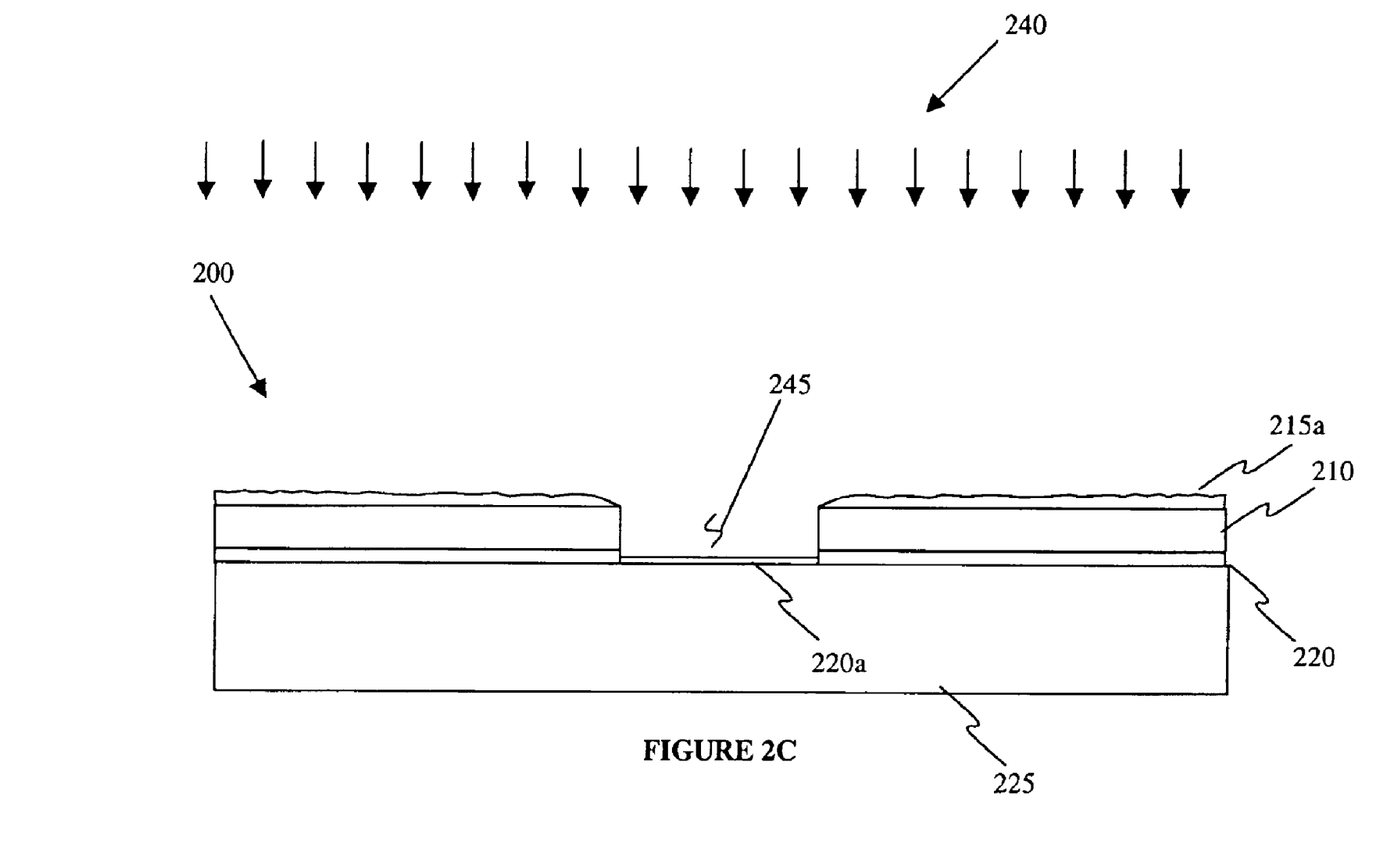
Figure 2D:
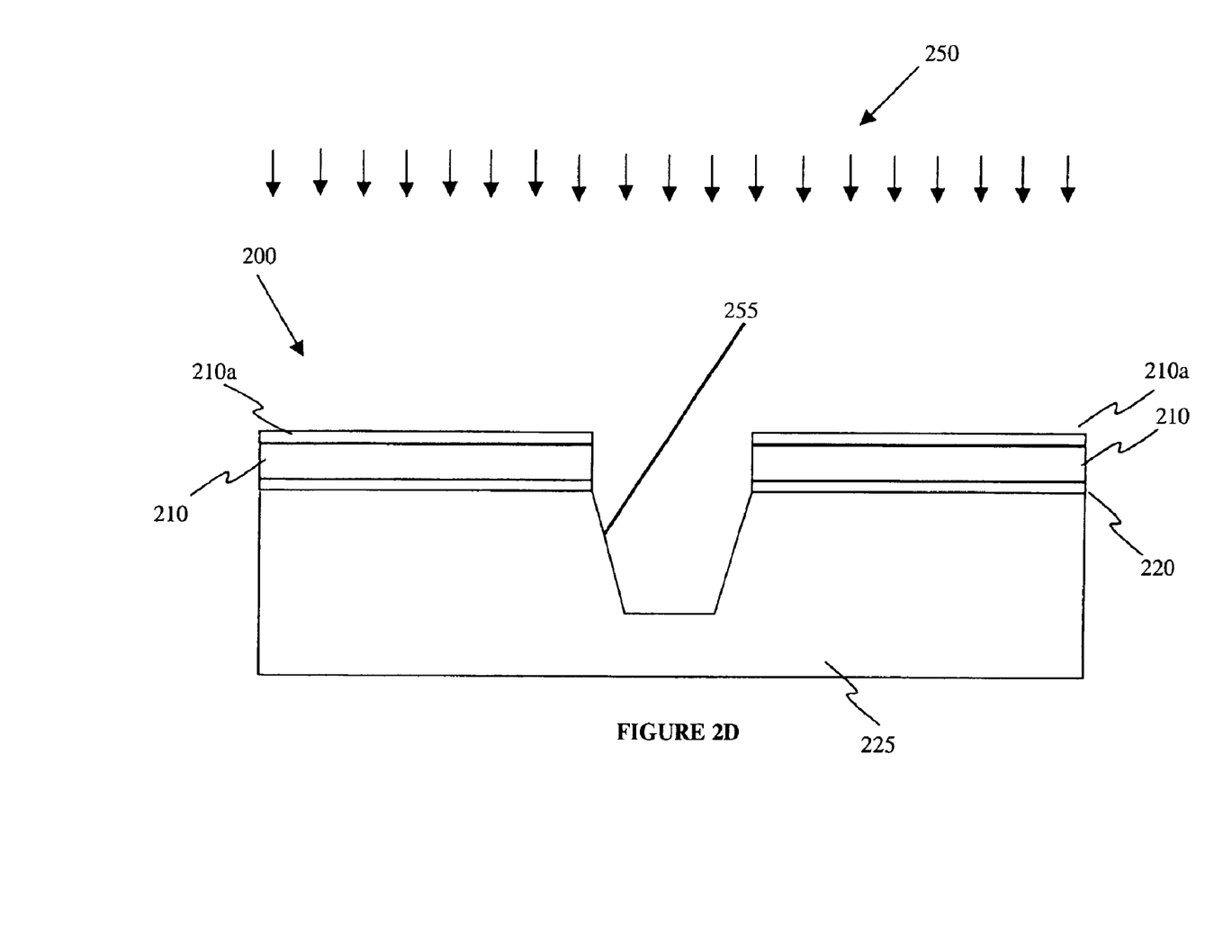

Turning now to FIG. 2D with continued reference to FIG. 2C, a plasma etch 250, similar to the plasma etch described in the paragraph above but using HBr and other gases, is conducted through the guide opening 245, which forms a trench 255 in the substrate 225. While the size of the trench 255 may vary, in a particularly advantageous embodiment, the trench 225, post plasma etch, is about 159 nm wide, at its widest point, and has a depth ranging from about 25 nm to about 40 nm, which is particularly useful in technologies employing sub-nanometer sized devices.

During the plasma etch 250, it is believed that an outer or upper portion of the hardmask layer 210 is modified via the ion bombarding or impregnating of silicon, oxygen or carbon in the hardmask layer 210 to form a modified layer 210a of the hardmask layer 210. As discussed above, it is further believed that due to this modification, this modified layer 210a is stressed differently than the underlying portion of the hardmask layer 210 or any subsequently deposited layers, which makes it susceptible to flaking during subsequent processes.

After the plasma etch 250 is completed, the etched substrate 225 is exposed to a conventional post ash clean process using a mixture of sulfuric/peroxide (SPM), ammonium hydroxide/peroxide (APM), or hydrochloric acid/peroxide (HPM), or combinations thereof to remove any remaining photoresist residues or etch polymers. Because the hardmask layer 210 was used to mask for a silicon etch, a hydrofluoric acid (HF) wash may also be included in the post ash clean. However, the modified layer 210a still remains. Thus, an additional post plasma clean process may be used to remove a substantial portion, if not all, of the modified layer 210a. A substantial portion is that which is enough to significantly reduce the number of true defects as discussed below. The post plasma clean process depends on the type of material used for the hardmask layer 210. For example, if the hardmask layer 210 is silicon nitride, it is advantageous to use a phosphoric acid. While, the concentration of the phosphoric acid may vary, in one particular embodiment, the phosphoric acid may be concentrated to about 92% phosphoric acid with the remaining percentage being water. It is advantageous that the hot phosphoric acid be used at a temperature of about 160° C. Preferably, the clean process is a wet etching process, and in an exemplary embodiment, it is conducted as an isotropic etch, which more quickly removes the modified layer 210a due to the undercutting action of the isotropic etch. However, in another embodiment, the etch may be anisotropic etch. In another example, if the hardmask layer 210 is silicon, a nitric acid/hydrofluoric chemistry may be used, and where the hardmask layer 210 is oxynitride, a phosphoric acid/oxidizer chemistry may be used. Thus, the chemistry involved in the clean process depends on the type of hardmask material being used. One who is skilled in the art would understand which chemistry is appropriate for which hardmask material.

Figure 2E:
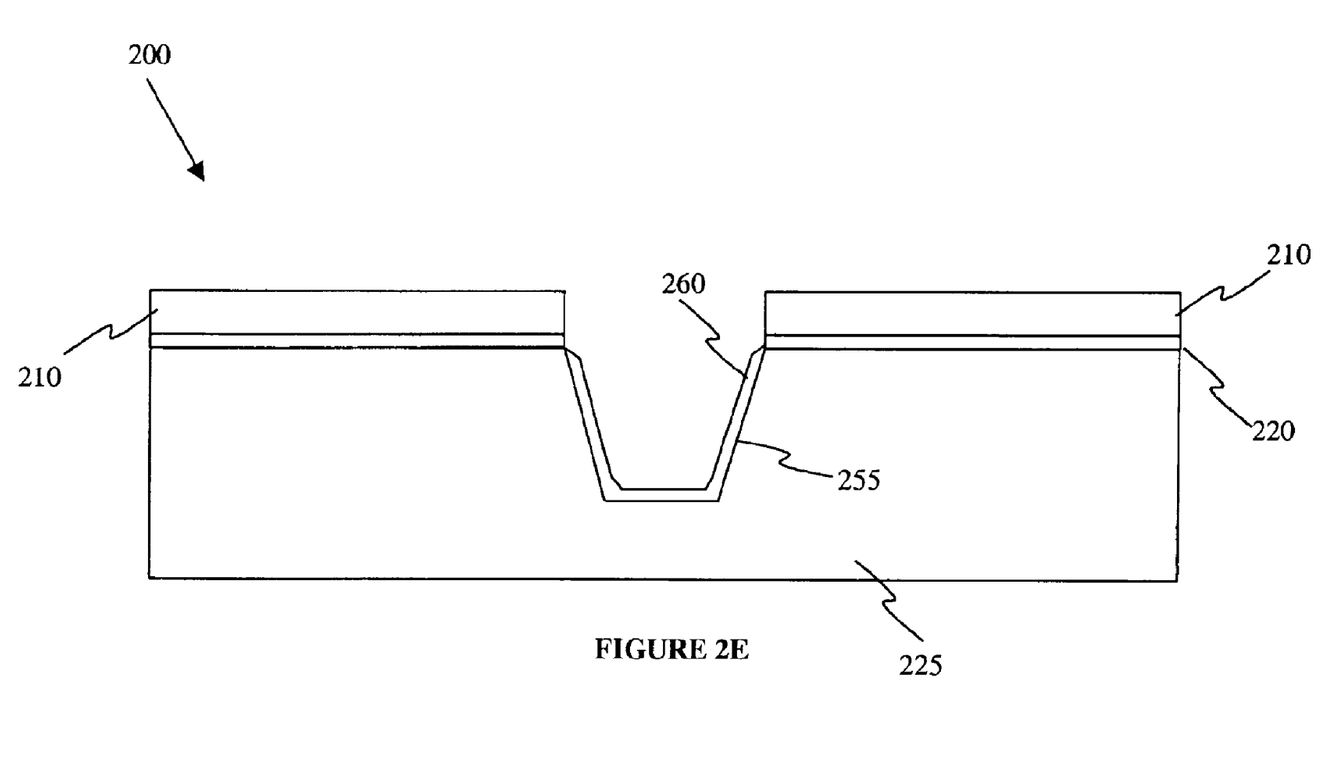

Turning now to FIG. 2E, there is shown another embodiment of the present invention after the removal of the modified layer 210a. It should be noted that in an advantageous embodiment, the trench 255 includes a conventionally formed oxide liner 260 located within the trench 255. In such embodiments, the post plasma clean may be conducted before the formation of the oxide liner 260 or subsequent to its formation. In FIG. 2E, the oxide liner 260 is shown formed subsequent to the removal of the modified layer 210a, as illustrated in the previous FIG. 2D.

Figure 2F:
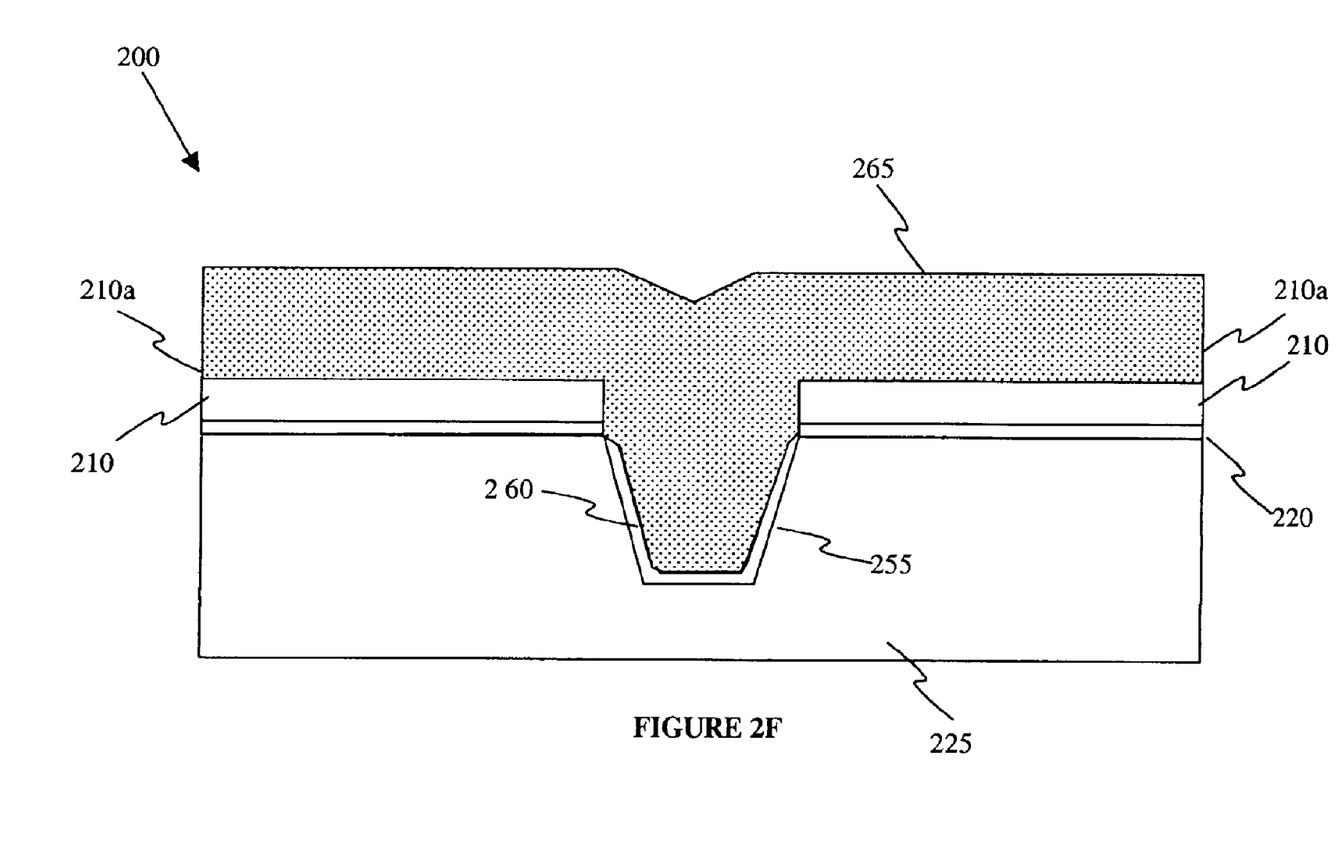
Figure 2G:
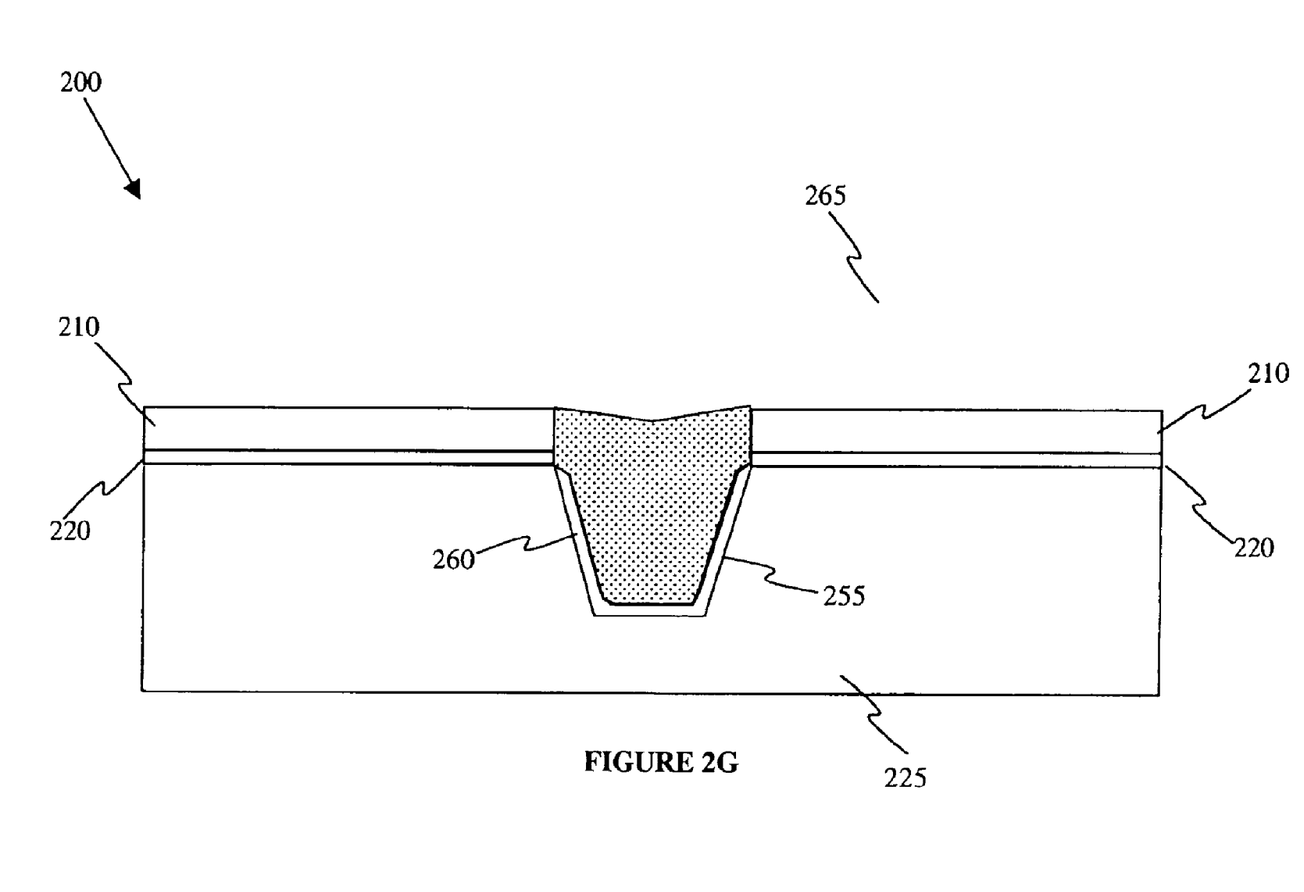
Figure 3:
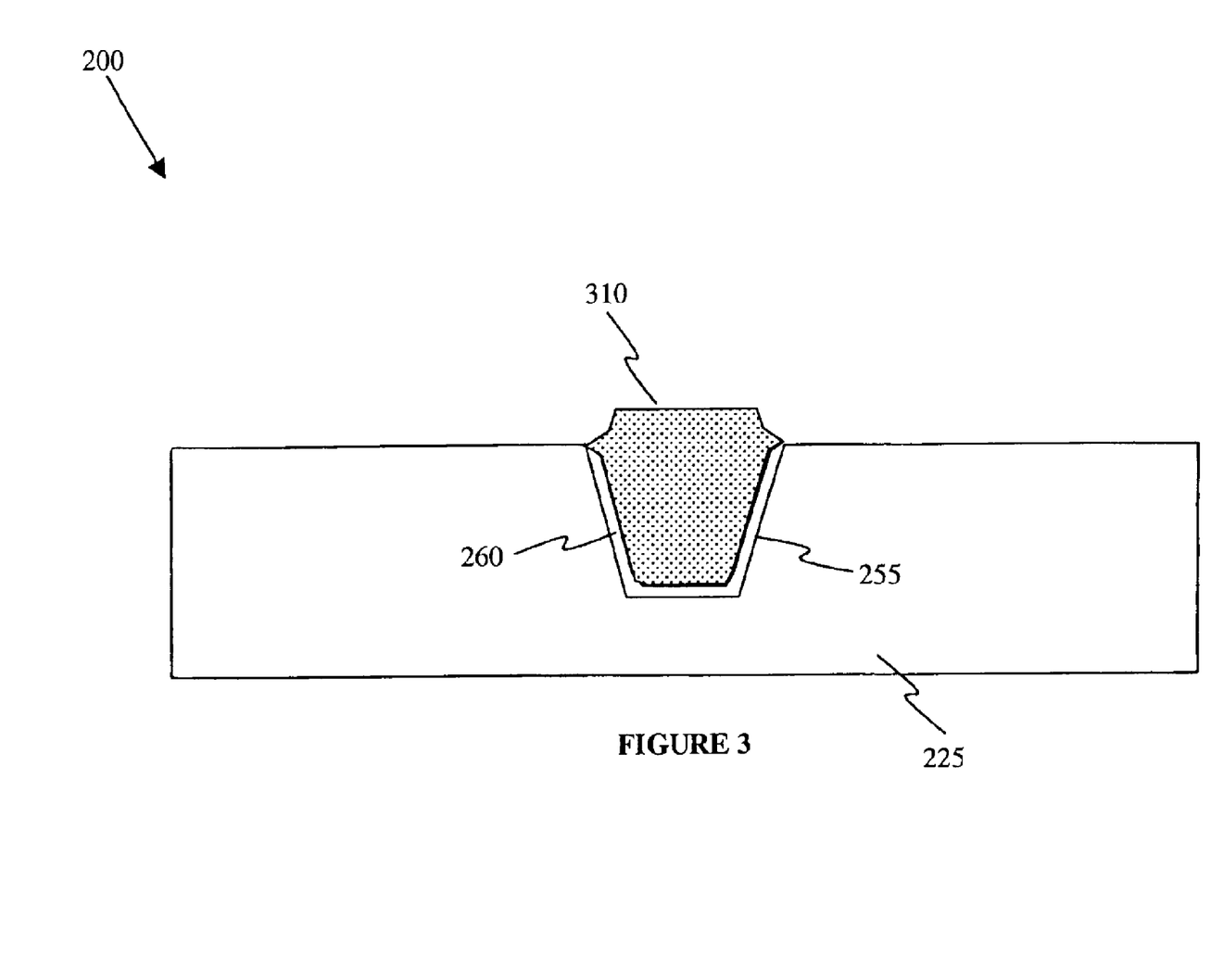
FIG. 3 illustrates a sectional view of the device of FIG. 2G following removal of the hardmask and pad oxide and completed formation of an isolation trench.

Following the formation of the oxide liner 260 and the removal of the modified layer 210a, the trench 255 is conventionally filled with a dielectric material 265, such an oxide, as shown in FIG. 2F. In one embodiment, the trench 255 is filled using a conventional high density plasma oxide. A substantial portion of the dielectric material 265 is then removed from an upper surface of the hardmask layer 210 using a conventional chemical/mechanical polishing (CMP) process, resulting in the structure shown in FIG. 2G. This is followed by a conventional hardmask and pad oxide strip, resulting in the structure 310 shown in FIG. 3, which in this particular example is an isolation trench for a transistor. It should be specifically understood, however, that while the foregoing figures have illustrated the formation of an isolation structure, the present invention is not so limited, and it could be used at any level or step within the fabrication process in which a hardmask layer is used to form a semiconductor feature.

The present invention, therefore, recognizes the advantages of removing the modified layer 210a of a hardmask layer 210 that could not be removed by the conventional post ash photoresist clean processes, by using a post plasma clean process. Previous attempts were made to solve this same problem by increasing APM time and temperature, increasing HF time, additional SPM and APM steps, and several other clean sequences, however, none were successful. Both HF and APM sequences etch oxide and to a lesser extent silicon. Because the sidewall of the isolation nitride pad oxide is exposed, ever increasing removal of this pad oxide is considered to be dangerous. Additionally, the same concern can also be said for etching the silicon exposed after the trench etch.

The time for exposing the plasma etched substrate to the post plasma clean process may vary. For example, the period of time may range from about 320 seconds to about 480 seconds during which time a thickness ranging from about 3 nm to about 24 nm of the modified layer 210a of the hardmask layer 210 may be removed. While specific ranges of times and amounts removed have been disclosed, those skilled in the art understand that such ranges can be tailored for any particular use.

Figure 4:
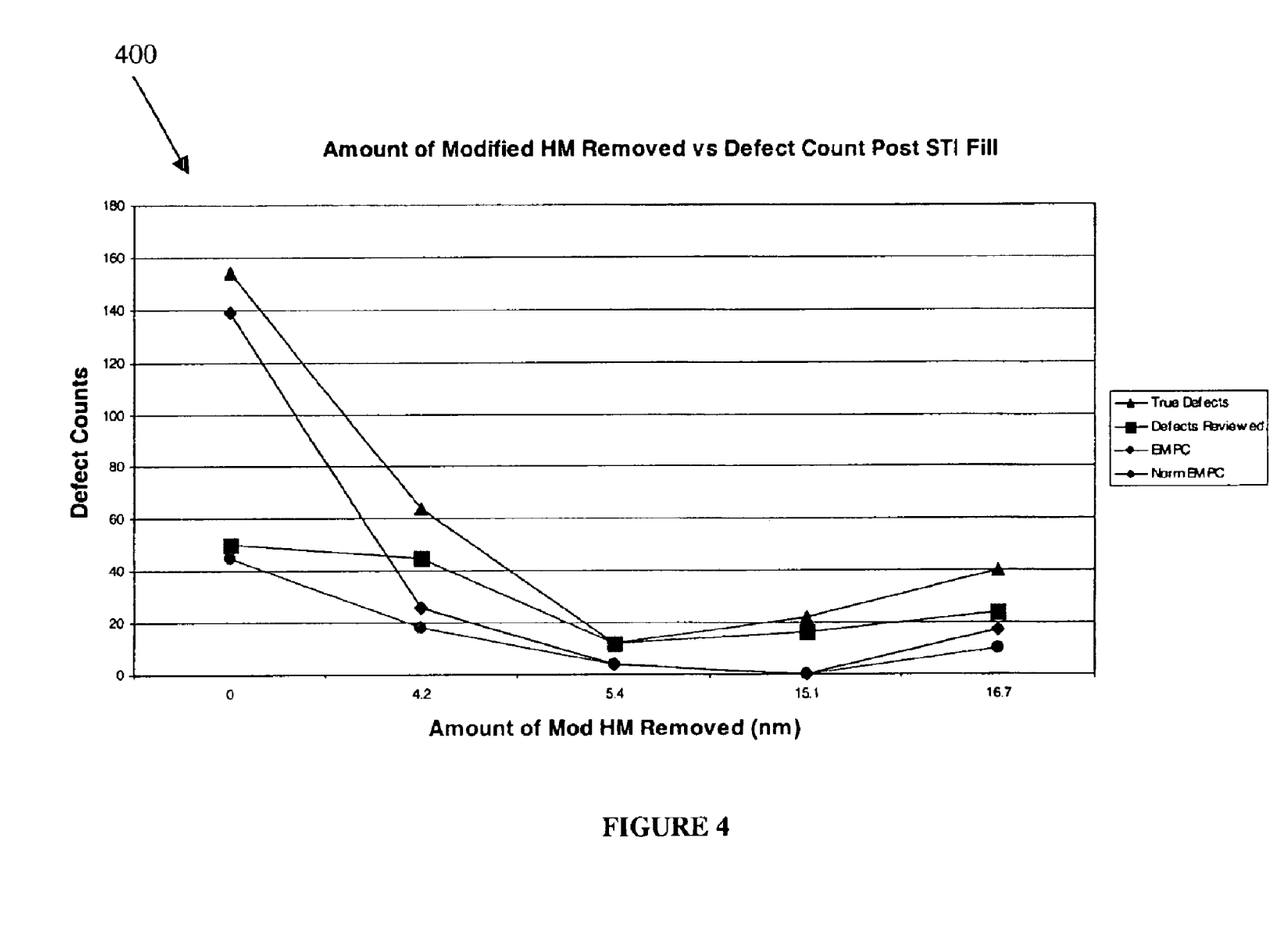
FIG. 4 is a graph illustrating Defect Counts versus amount of modified hardmask removed, post STI fill.

Turning briefly to FIG. 4, illustrated is a graph 400 showing the correlation of the decrease in defects with the utilization of the phosphoric acid chemistry. Specifically, FIG. 4 compares the number of measured defects for varying amounts of removed modified hardmask. As seen from the data in FIG. 4, the samples that were subjected to the plasma clean process, which in this particular example included phosphoric acid, showed a significant decrease in the number of true defects. In one particular aspect of the present invention, improved results were achieved by removing about 5.4 nm of the upper portion of the hardmask layer 210, which effectively removed the modified layer 210a such that flaking was substantially minimized, as indicated.

Figure 5A:
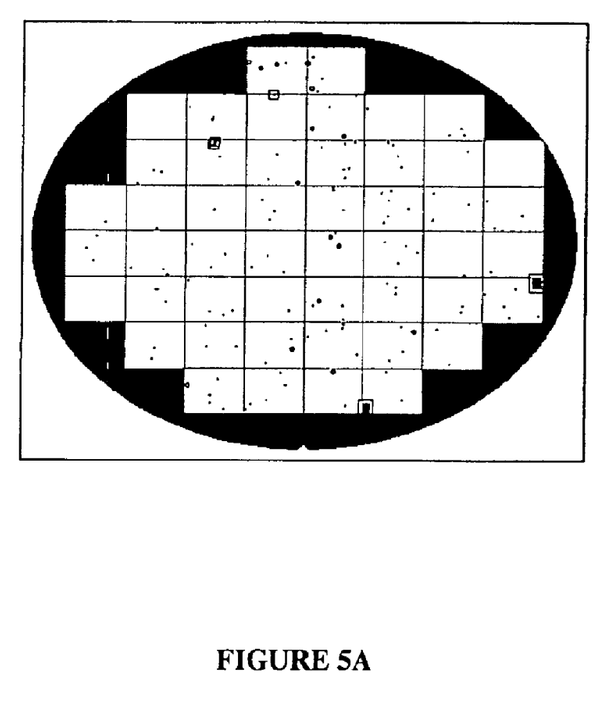
FIGS. 5A and 5B are defect comparison graphs of a wafer that is not fabricated using the present invention with a wafer that is fabricated using the present invention.
Figure 5B:
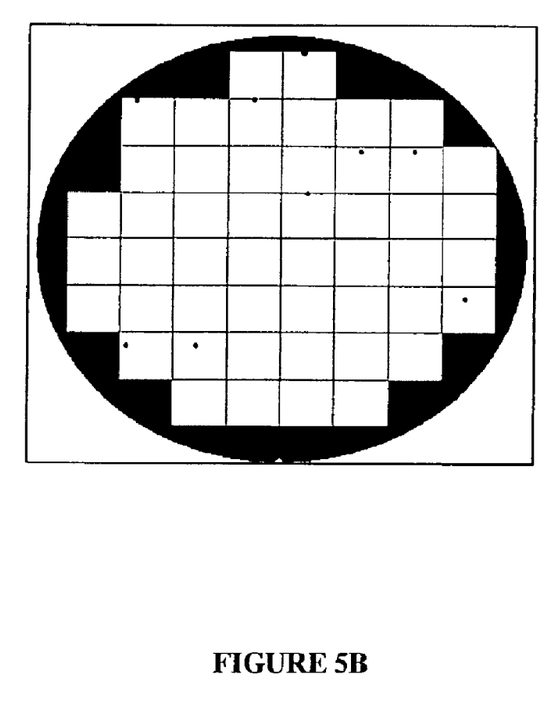

This improved decrease in true defect density is further illustrated in the comparison of FIG. 5A, which is a defect density graph of the wafer that was not subjected to the post plasma clean process, to FIG. 5B, which is a defect density graph of a wafer that was subjected to the post plasma clean process. The true defects on the wafer not subjected to the post plasma clean process were reported to be about 154 while the true defects on the wafer subjected to the post plasma clean process were reported to be only about 12. Thus, there was a substantial decrease in the number of defects when the device was subjected to the post plasma clean process, which in turn shows that at least a substantial portion of the modified layer 210a was removed during the post plasma clean process.

Figure 6:
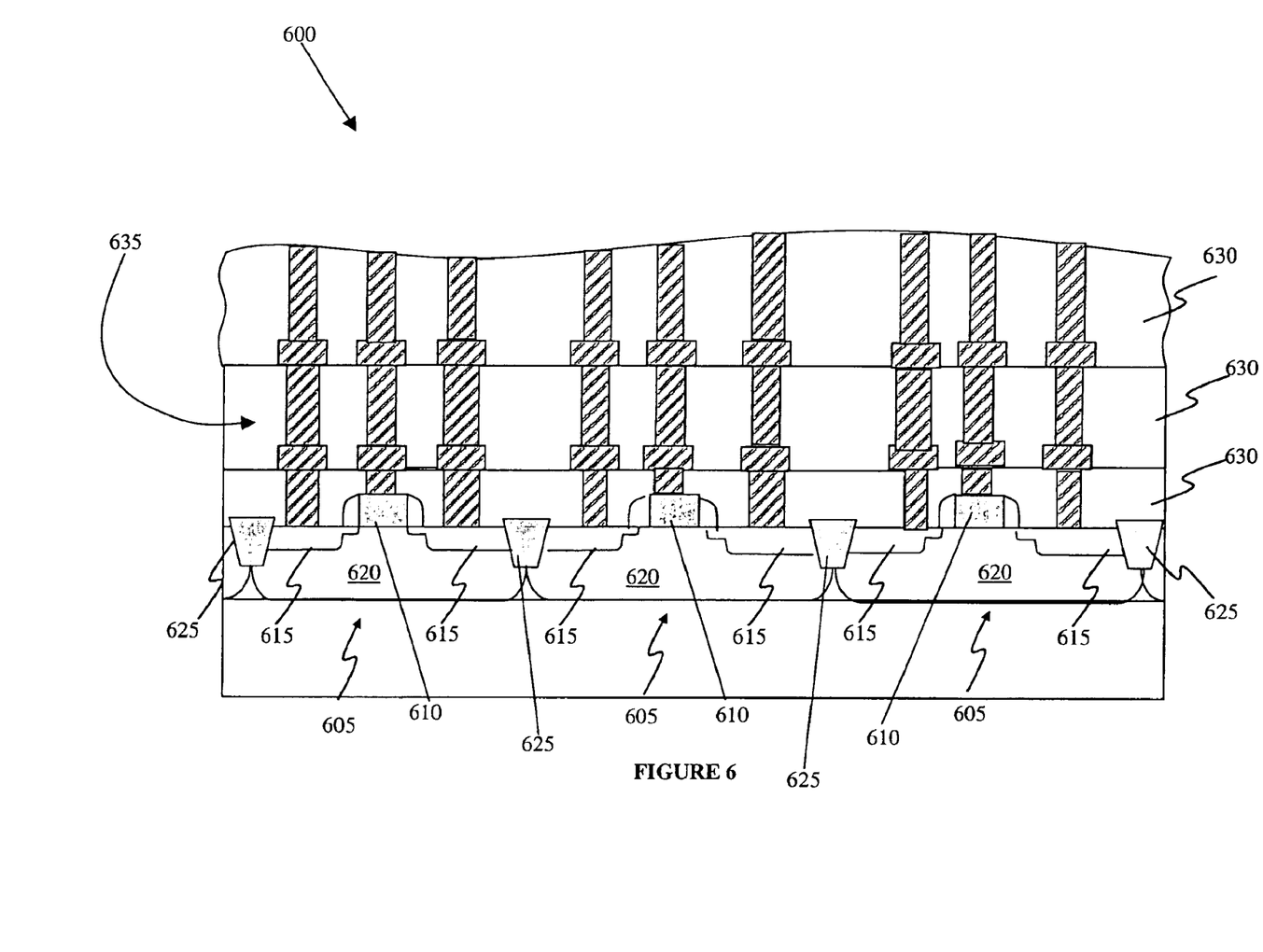
FIG. 6 illustrates a sectional view of an integrated circuit device fabricated in accordance with the present invention.

As seen from the foregoing, the above-described process can be used to manufacture an integrated circuit that has far fewer defects than those afforded by present conventional post ash photoresist clean processes. Morever, the present invention can be used at any stage of manufacture in which it is desirable to use a hardmask in addition to a photoresist mask or in place of a photoresist mask. FIG. 6 represents an example of one such integrated circuit device. The integrated circuit 600 includes transistors 605 that include gates 610 and source/drains 615 formed in wells 620, which can be doped to form a complementary metal oxide semiconductor design layout. Isolation structures 625, such as STIs, separate and electrically isolate the transistors 605 from each other. The process discussed above and covered by the present invention may be used to form any of these structures that require the use of hardmask material. For example, the present invention could be used form the isolation structures 625 or the interconnect structures 635. Interlevel dielectric layers 630 are located over the transistors 605, and interconnects 635 are formed therein to interconnect the various transistors 605 to form an operative integrated circuit. Given the teachings of present application, one who is skilled in the art would know how to form the operative integrated circuit as shown in FIG. 6.

Although the present invention has been described in detail, one of ordinary skill in the art should understand that they can make various changes, substitutions and alterations herein without departing from the scope of the invention.

What is claimed is:

1. A process of manufacturing an integrated circuit, comprising:

forming isolation trenches in a semiconductor substrate, including:
plasma etching through a patterned hardmask layer located over a semiconductor substrate wherein said plasma etching forms a modified layer on said hardmask layer; and
removing at least a substantial portion of said modified layer by exposing said modified layer to a post plasma clean process;

forming transistor structures on and within said substrate and between said isolation trenches; and forming interconnects within dielectric layers located over said transistor structures that interconnect said transistor structures to form an operative integrated circuit.

2. The process as recited in claim 1, wherein said removing includes exposing said modified layer to an isotropic etch.

3. The process as recited in claim 2, wherein said isotropic etch includes phosphoric acid.

4. The process as recited in claim 1, wherein plasma etching includes etching through a patterned hardmask comprising silicon or nitrogen.

5. The process as recited in claim 1 further including removing a photoresist layer from said patterned hardmask prior to said plasma etching.

6. The process as recited in claim 1, wherein removing includes removing all of said modified layer to thereby leave an unmodified hardmask layer.

7. The process as recited in claim 1 further including forming an oxide liner in said trench.

8. The process as recited in claim 7, wherein forming said oxide liner includes forming said oxide liner prior to said removing.

9. The process as recited in claim 1 wherein exposing includes removing an upper thickness of said patterned hardmask layer ranging from about 3 nm to about 24 nm.

10. The process as recited in claim 1 wherein forming transistor structures includes forming a gate on said semiconductor substrate and forming wells and source/drain regions within said wells.

* * * * *